(12) United States Patent
Ota et al.

(10) Patent No.: US 7,859,575 B2
(45) Date of Patent: Dec. 28, 2010

(54) IMAGING DEVICE AND DRIVING METHOD THEREOF

(75) Inventors: Keisuke Ota, Tokyo (JP); Seiji Hashimoto, Yokohama (JP); Kazuyuki Shigeta, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 399 days.

(21) Appl. No.: 12/035,804

(22) Filed: Feb. 22, 2008

(65) Prior Publication Data

US 2008/0291304 A1    Nov. 27, 2008

(30) Foreign Application Priority Data

Mar. 6, 2007    (JP)    ............... 2007-055769

(51) Int. Cl.
   *H04N 5/228*    (2006.01)
(52) U.S. Cl. ................................. 348/222.1
(58) Field of Classification Search ............... 348/222.1
   See application file for complete search history.

(56) References Cited

U.S. PATENT DOCUMENTS

| | | | |
|---|---|---|---|
| 4,731,665 A | 3/1988 | Hashimoto et al. | 358/213.27 |
| 4,959,723 A | 9/1990 | Hashimoto | 358/213.11 |
| 4,962,412 A | 10/1990 | Shinohara et al. | 357/30 |
| 5,146,339 A | 9/1992 | Shinohara et al. | 358/212 |
| 6,463,178 B1 * | 10/2002 | Kondo et al. | 382/232 |
| 7,499,091 B2 * | 3/2009 | Abe et al. | 348/308 |
| 7,583,302 B2 * | 9/2009 | Hoshino | 348/241 |
| 2003/0231251 A1 * | 12/2003 | Tsukioka | 348/272 |
| 2006/0119722 A1 * | 6/2006 | Mabuchi et al. | 348/308 |
| 2006/0138577 A1 | 6/2006 | Hashimoto | 257/432 |
| 2007/0188632 A1 * | 8/2007 | Kobayashi | 348/240.99 |

FOREIGN PATENT DOCUMENTS

| | | |
|---|---|---|
| JP | 9-214836 A | 8/1997 |
| JP | 2000-032318 A | 1/2000 |

* cited by examiner

*Primary Examiner*—James M Hannett
(74) *Attorney, Agent, or Firm*—Fitzpatrick, Cella, Harper & Scinto

(57) ABSTRACT

There is provided an imaging device which eliminates complexity in reading an image in low resolution and reading an image in high resolution and realizes prevention of decrease in frame rate. The device includes a pixel region including a plurality of pixel elements and imaging an incident light of an object as an image and a reading unit for thinning out a pixel element from the pixel region to read a thinned out image in low resolution and reading a partial image in resolution higher than the thinned out image from a partial region of the pixel region (a horizontal shift register and a vertical shift register), wherein the reading unit reads the thinned out image and the partial image from mutually different pixel elements and reads the thinned out image and the partial image as different imaging frames.

7 Claims, 9 Drawing Sheets

(THINNED OUT PIXEL C IS NOT USED IN PARTIAL IMAGES A AND B)

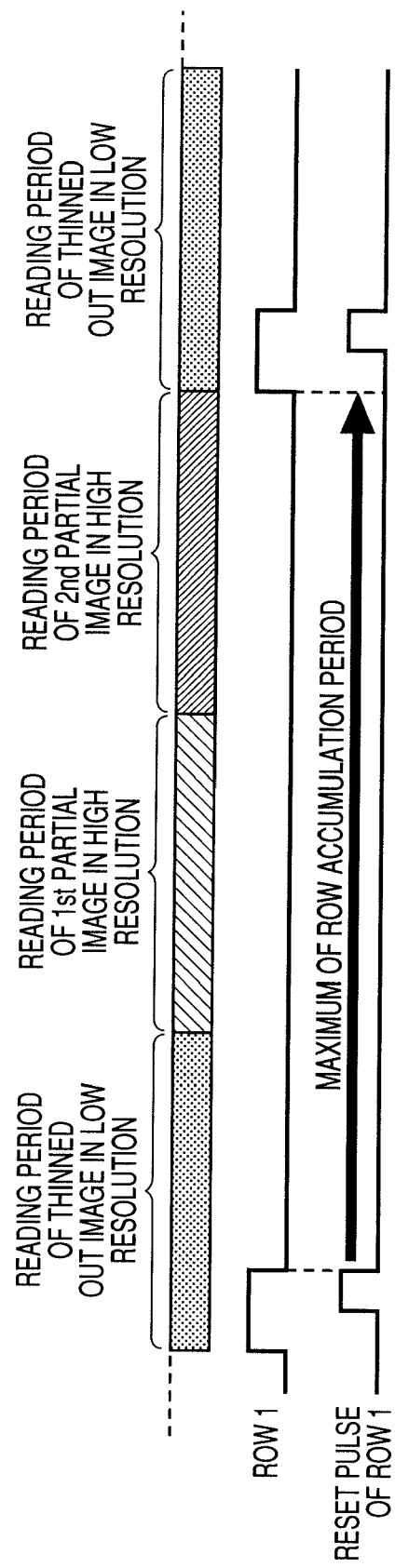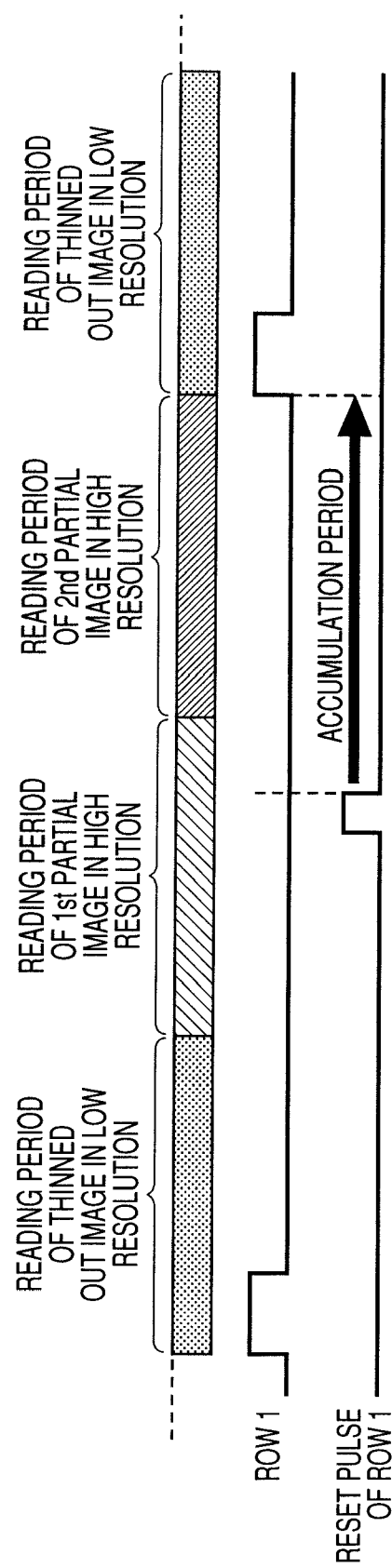

IMAGING DEVICE AND DRIVING METHOD THEREOF

BACKGROUND OF THE INVENTION

1. Field of the Invention

The present invention relates to an imaging device which includes a pixel region including a plurality of pixel elements and imaging an incident light of an object as an image and a driving method thereof.

2. Description of the Related Art

As a conventional imaging device capable of imaging a wide imaging area with low resolution and imaging a predetermined partial imaging area with high resolution, there is, for example, Japanese Patent Application Laid-Open No. H09-214836 and Japanese Patent Application Laid-Open No. 2000-032318.

In Japanese Patent Application Laid-Open No. H09-214836, an imaging device capable of reading data of a predetermined pixel element is used. And a block mode for reading only the pixel element of a predetermined block among all pixel elements, and a skip mode for reading all pixel elements at a predetermined thinning-out rate are switched to drive, write in memory and display. Thereby, an imaging device capable of implementing adjustment of angle of view prior to imaging and image display for focusing rapidly and accurately is provided. Moreover, an imaging device capable of making a fully-displayed image on one display with short recurrence cycle and an image displayed in a partially-enlarged manner viewable at the same time is provided.

In addition, in Japanese Patent Application Laid-Open No. 2000-032318, an imaging device comprising a solid-state imaging device having a two-dimensional pixel array and made to scan in a plurality of scanning modes has been disclosed. This imaging device scans all pixel elements only of a pixel group of a continued predetermined region in the pixel array of the solid-state imaging device. Moreover, this imaging device comprises a scan control unit scanning the pixel group in the remaining region of the pixel array in a thinning out manner and a video signal separating unit separating a video signal from the entire pixel scanning region and a video signal from a thinning out scanning region each other. Thereby, an imaging device capable of obtaining from the same frame entire image information by thinning out scanning and high resolution partial image information by entire pixel scanning at the same time is provided.

However, the above described two patent documents respectively include the following problems. At first, the imaging device described in Japanese Patent Application Laid-Open No. H09-214836 uses the same pixel element at the occasion of reading an image in low resolution and reading an image in high resolution. Therefore, also in the case of reading a frame in low resolution and a frame in high resolution alternately, accumulation and pixel reading have to be carried out chronologically for each frame to consequently reduce the effective frame rate, giving rise to a problem.

In addition, the imaging device described in Japanese Patent Application Laid-Open No. 2000-032318 will obtain an image in low resolution and an image in high resolution from the same frame. Therefore, exposure control or the gain of each pixel element has to be adjusted on each image and, therefore, change in driving timing of a sensor becomes complicated, giving rise to a problem.

Moreover, both of the above described imaging devices are not considered on the driving frequency at the time of image reading; a frame rate of each image will be change in the case where a plurality of images in high resolution are read, giving rise to a problem.

SUMMARY OF THE INVENTION

The present invention has been attained in view of the above described problems and an object thereof is to provide an imaging device capable of realizing prevention of decrease in frame rate without complicating reading of an image in low resolution and an image in high resolution and to provide a driving method thereof.

An imaging device of the present invention includes a pixel region including a plurality of pixel elements and imaging an incident light of an object as an image and a reading unit for thinning out a pixel element from the pixel region to read a thinned out image in low resolution and reading a partial image in resolution higher than the thinned out image from a partial region of the pixel region, wherein the reading unit reads the thinned out image and the partial image from mutually different pixel elements and reads the thinned out image and the partial image as mutually different imaging frames. In addition an imaging device of the present invention includes a pixel region including a plurality of pixel elements and imaging an incident light as an image and a reading unit for thinning out a pixel element from the pixel region to read a thinned out image in low resolution and reading a partial image in resolution higher than the thinned out image from a partial region of the pixel region, wherein the reading unit reads the thinned out image and the partial image from mutually different pixel elements and reads in mutually different accumulation periods.

A method of driving an imaging device of the present invention is a method of driving an imaging device which includes a pixel region including a plurality of pixel elements and imaging an incident light of an object as an image, wherein the method comprises steps of; reading out a thinned out image in low resolution by thinning out a pixel element from the pixel region; and reading out a partial image from a partial region of the pixel region in higher resolution than the resolution of the thinned out image. During the two reading steps, the thinned out image and the partial image are read out from respectively different pixel elements, and from respectively different imaging frame.

According to the present invention, it is possible to realize prevention of decrease in frame rate without complicating reading of an image in low resolution and an image in high resolution.

Further features of the present invention will become apparent from the following description of exemplary embodiments with reference to the attached drawings.

BRIEF DESCRIPTION OF THE DRAWINGS

FIGS. 11A and 11B are timing charts illustrating an example of input timing of a reset pulse determining setting of an accumulation period of a pixel element in a row 1.

DESCRIPTION OF THE EMBODIMENTS

With reference to the accompanying drawings, embodiments of the present invention will be described below.

Figure 1:
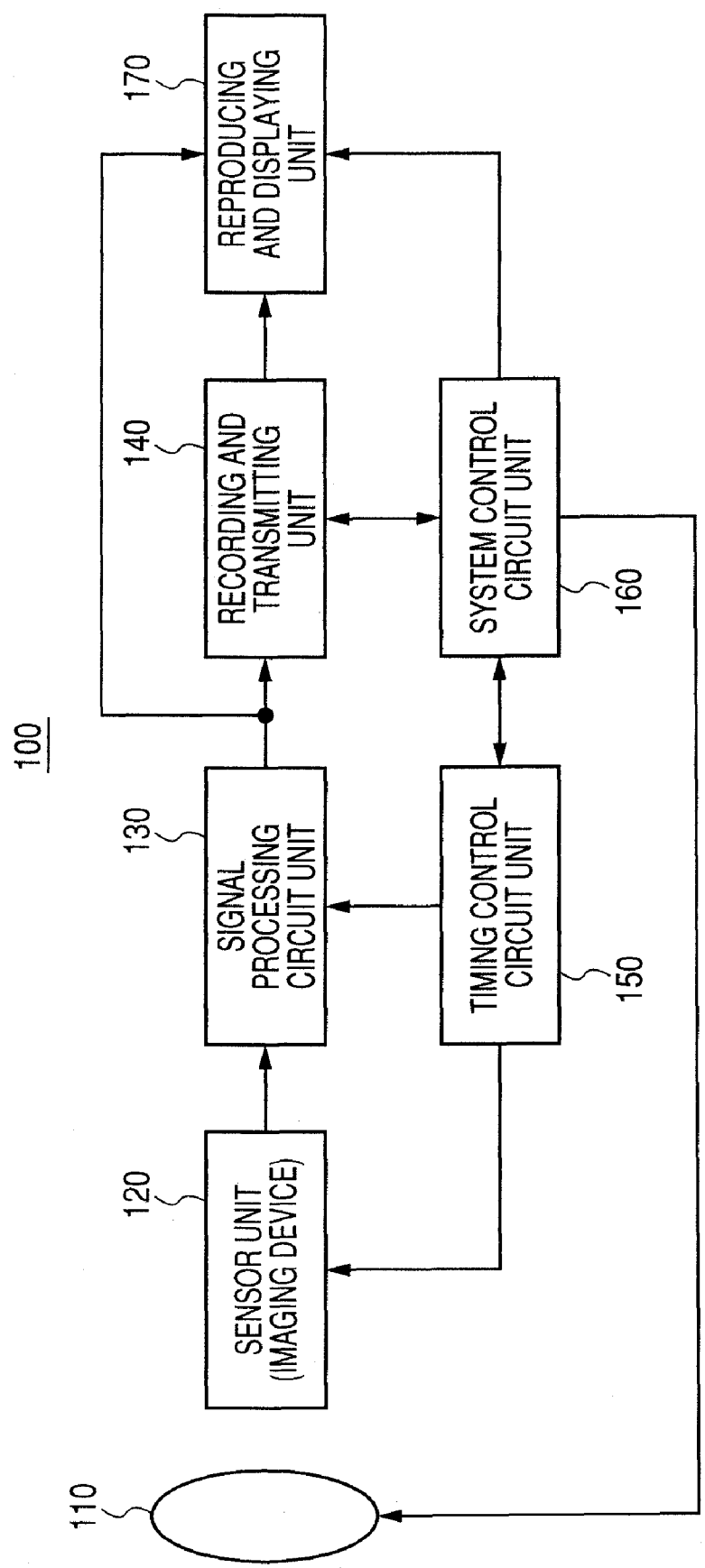
FIG. 1 is a diagram illustrating an example of a schematic configuration of an imaging device related to an embodiment of the present invention.

FIG. 1 is a diagram illustrating an example of a schematic configuration of an imaging device related to an embodiment of the present invention. An imaging device 100 comprises, for example, an optical unit 110, a sensor unit (imaging device) 120, a signal processing circuit unit 130, a recording and transmitting unit 140, a timing control circuit unit 150, a system control circuit unit 160 and a reproducing and displaying unit 170.

An incident light of an object through the optical unit 110 is focused on the sensor unit (imaging device) 120 to form an image. The sensor unit (imaging device) 120 includes, for example, a pixel region where pixel elements are arranged in a two dimensional matrix. When the incident light of an object is focused in the pixel region to form an image, the light of an object is converted into an electrical signal (image signal) by each pixel element of the pixel region and an image is imaged.

The image signal converted in each pixel element of the sensor unit (imaging device) 120 undergoes signal conversion processing in a predetermined method in the signal processing circuit unit 130. And, the image signal having undergone signal processing by the signal processing circuit unit 130 is recorded by a recording medium, transmitted to an external apparatus by the recording and transmitting unit 140 or is directly sent to the reproducing and displaying unit 170 and is reproduced and displayed. In addition, the image signal recorded in a recording medium by the recording and transmitting unit 140 is transmitted to the reproducing and displaying unit 170 according to necessity and is reproduced and displayed.

The timing control circuit unit 150 controls the driving timing for the sensor unit (imaging device) 120 and the signal processing circuit unit 130 based on control by the system control circuit unit 160. The system control circuit unit 160 controls operation of the imaging device synthetically and controls respective component units of the optical unit 110, the recording and transmitting unit 140, the timing control circuit unit 150 and the reproducing and displaying unit 170. In addition, the system control circuit unit 160 controls drive of the sensor unit (imaging device) 120 and the signal processing circuit unit 130 through the timing control circuit unit 150.

Figure 2:
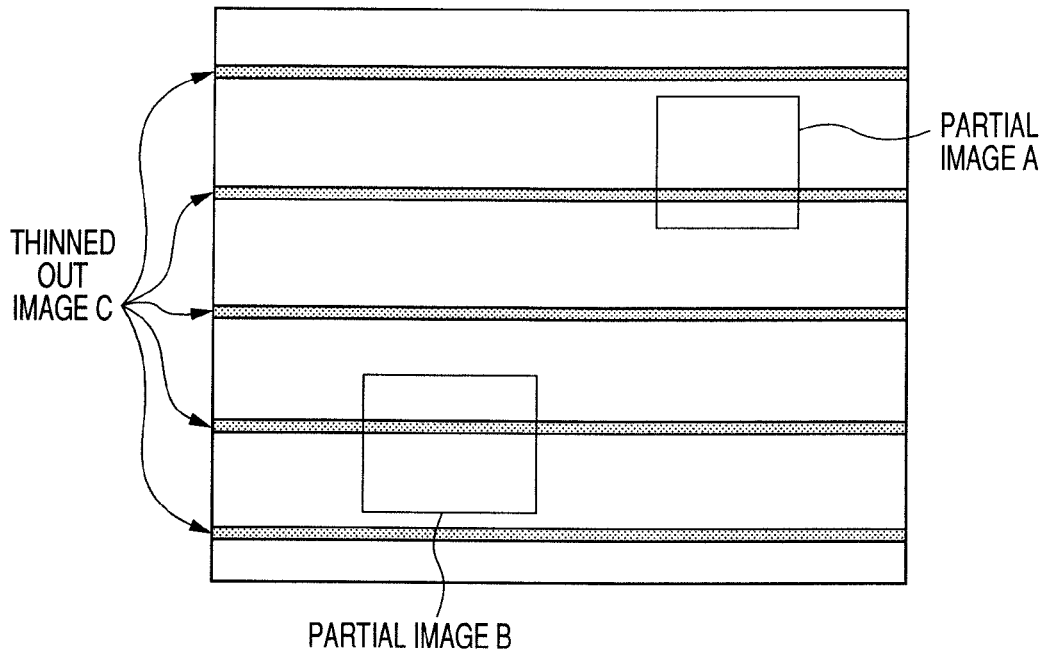
FIG. 2 is a schematic diagram illustrating an example of an embodied image by the imaging device related to the embodiment of the present invention.

Next, at first, the present invention will be described briefly. FIG. 2 is a schematic diagram illustrating an example of an embodied image by the imaging device related to the embodiment of the present invention. Here, FIG. 2 schematically illustrates relation between a pixel region 121 provided in the sensor unit (imaging device) 120 and partial images A and B after being read from each pixel element of the pixel region 121 and a thinned out image C. That is, FIG. 2 illustrates the pixels for thinned out image (C) and the pixels for partial images (A, B) among pixel elements included in the pixel region 121.

As illustrated in FIG. 2, the entire image in the pixel region 121 is formed based on a small number of pixel signals read from the pixels for thinned out image (C). Here, the entire image is thinned out and read from the entire pixel region 121 and, therefore, will become an image in low resolution. And, for example, the system control circuit unit 160 controls recording of and monitors this entire image and determines a noticed image region to be noticed from the result of monitoring thereof. And, for example, the system control circuit unit 160 reads and brings a small number of pixel signals in that noticed image region into signal processing and, thereby, the partial image A and the partial image B in high resolution are formed and undergo processing corresponding with an object of monitoring.

In the present invention, the pixel elements utilized for the partial images (A, B) will not be utilized as pixel elements utilized for the thinned out image (C). That is, in the case illustrated in FIG. 2, in the pixel regions of the partial images (A, B), the pixel signals from the pixels for thinned out image (C) will not be read at the time of reading the relevant partial images (A, B).

The timing control circuit unit 150 drives the pixels for thinned out image (C) and the pixels for partial images (A, B) as mutually different imaging frames. Accordingly, exposure is carried after the pixel elements of the pixel region 121 are reset. Exposure control and drive control of pixel elements until being read next can be switched each imaging frame and, therefore, the relevant control can be extremely simplified.

In addition, the timing control circuit unit 150 selects a low resolution reading mode on the entire image by thinning out reading and a high resolution reading mode by partial image reading based on control by the system control circuit unit 160. At that occasion, the low resolution reading mode on the entire image by thinning out reading and the high resolution reading mode by partial image reading are different in horizontal drive pulse and vertical drive pulse. Accordingly, the driving timing of the sensor unit (imaging device) 120, the resolution processing of the signal processing circuit unit 130 and the recorded pixel number recorded and processed in the recording and transmitting unit 140 are required to be changed for each reading mode. These controls are carried out corresponding with each reading mode by the system control circuit unit 160.

In addition, according to the reading modes, control is carried out so that sensitivity of the sensor unit (imaging device) 120 is different. Specifically, the system control circuit unit 160 controls diaphragm (not illustrated in the drawing) of the optical unit 110. In addition, as another method, it is also considered that the gain of an amplifying circuit (amplifier) inside the sensor unit (imaging device) 120 is changed to increase by a control pulse from the timing control circuit unit 150 so as to obtain a proper signal.

Next, the example of the embodied image of the present invention illustrated in FIG. 2 will be described for easier understanding in the pixel level of the pixel region 121.

Figure 3:
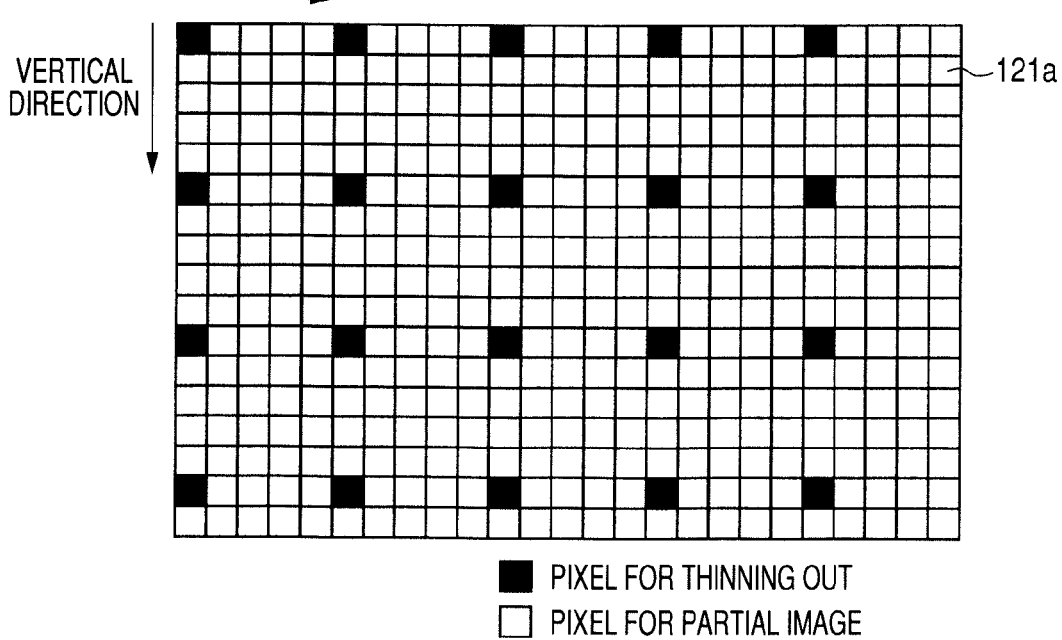
FIG. 3 is a schematic diagram of a pixel region illustrating an example of the embodied image by the imaging device related to the embodiment of the present invention.
Figure 4:
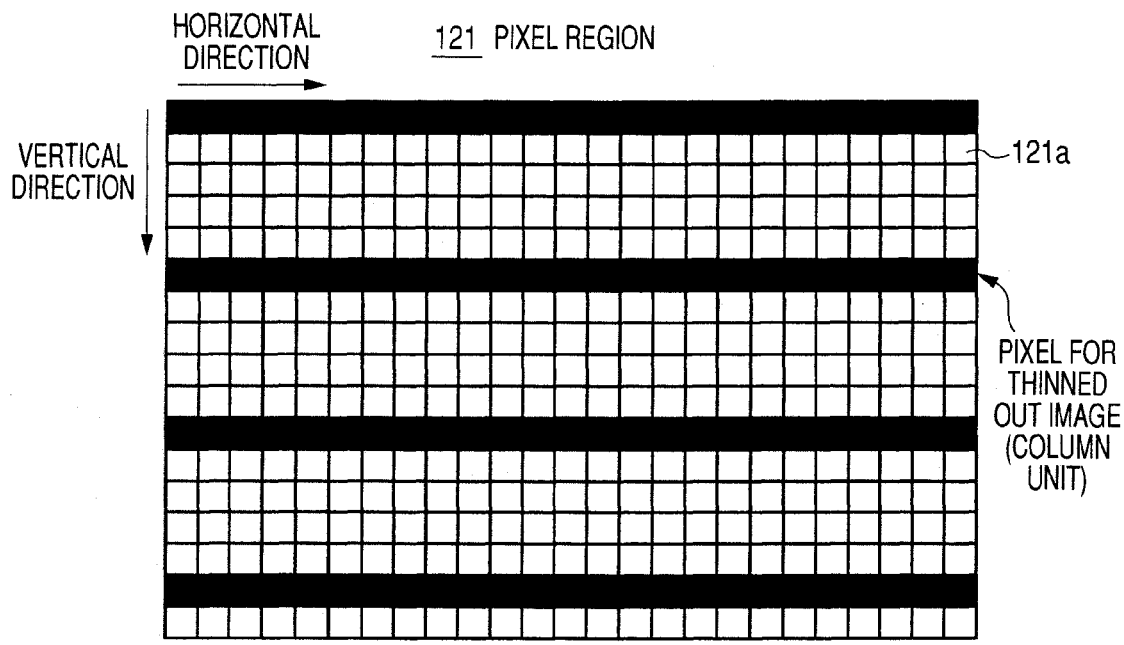
FIG. 4 is a schematic diagram of a pixel region illustrating an example of an embodied image by the imaging device related to the embodiment of the present invention.
Figure 5:
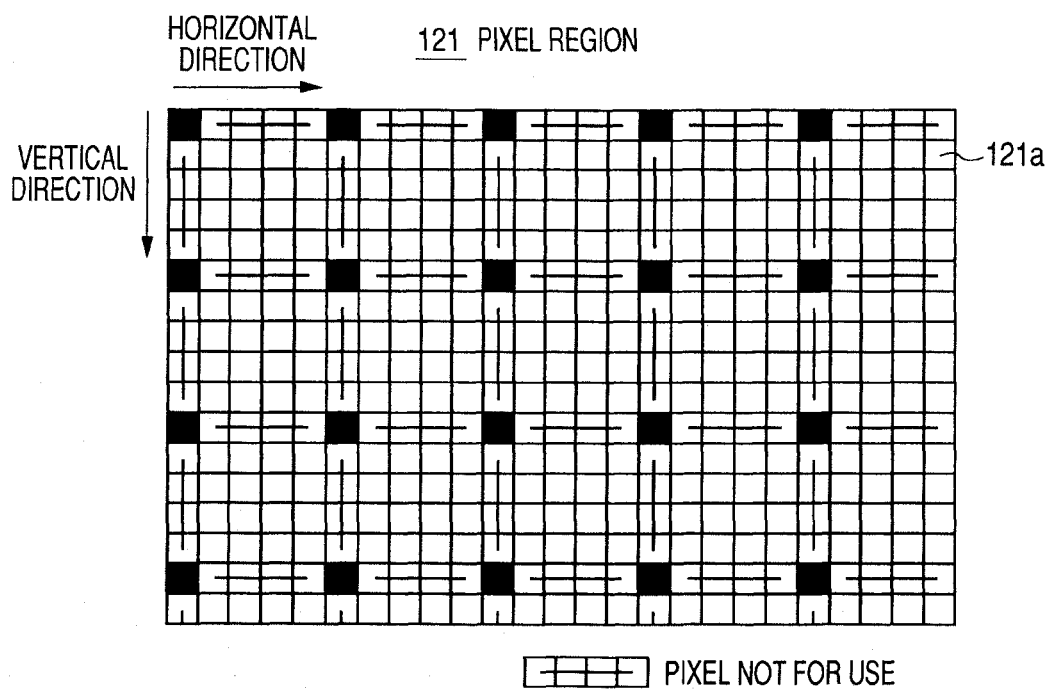
FIG. 5 is a schematic diagram of a pixel region illustrating the example of an embodied image by the imaging device related to the embodiment of the present invention.

FIG. 3, FIG. 4 and FIG. 5 are schematic diagrams of the pixel region 121 illustrating an example of an embodied image by the imaging device related to the embodiment of the present invention. In FIG. 3, FIG. 4 and FIG. 5, one pixel element (unit pixel element) 121a is illustrated by a square. In FIG. 3, FIG. 4 and FIG. 5, a square (■) painted with black color specifies a pixel for thinned out image and a blank square (□) specifies a pixel for partial image.

In the example illustrated in FIG. 3, a pixel for thinned out image in the horizontal direction and the vertical direction is treated as a point. By reading such a pixel for thinned out image, the driving frequency can be made to be the lowest frequency and enables power saving and reduction of the memory capacity of the signal processing circuit unit 130. In addition, influence to resolution of a partial image can be made small to such a level that deterioration due to the pixel for thinned out image can be ignored. An example of a circuit diagram of an optimum unit pixel for the example illustrated in FIG. 3 is illustrated in FIG. 6.

Figure 6:
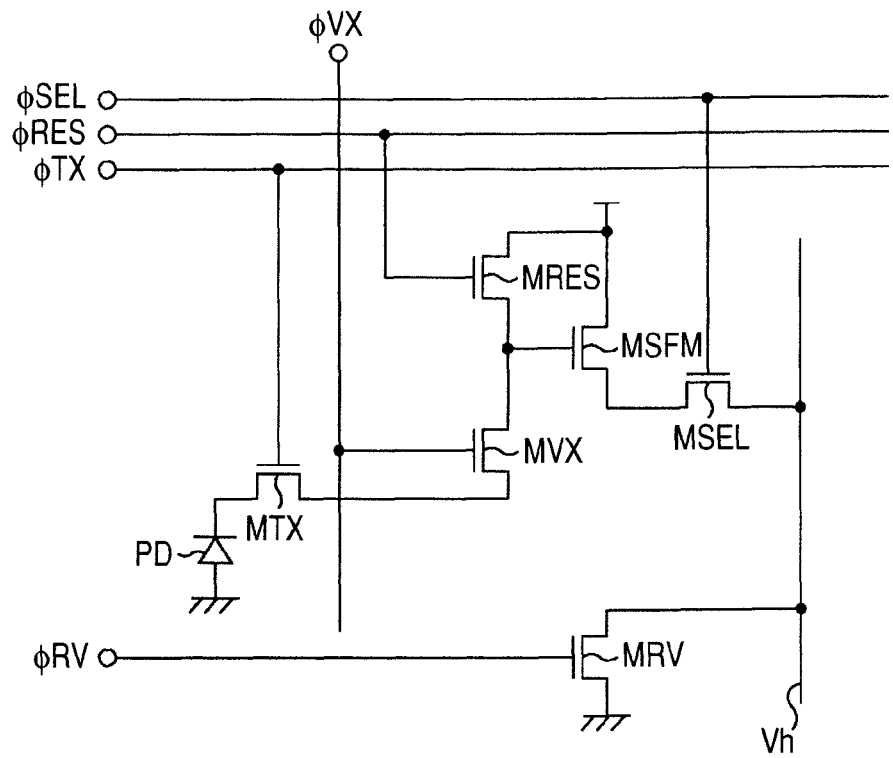
FIG. 6 is a diagram illustrating an example of a circuit in a unit pixel element of a pixel region enabling random access.

FIG. 6 is a diagram illustrating an example of a circuit in a unit pixel element of a pixel region enabling random access. To a unit pixel element 121a illustrated in FIG. 6, a photodiode PD being a photoelectric conversion unit, a transfer switch MTX for controlling and transferring a signal charge of a photodiode PD to the gate portion of a pixel amplifier MSFM (floating diffusion) and a transfer switch MVX are connected. By controlling and transferring horizontal selection on the relevant pixel element with the transfer switch MTX and vertical selection on the relevant pixel element with the transfer switch MVX, random access to a pixel element becomes feasible. A residual charge of the photodiode PD is removed by bringing the transfer switch MTX, the transfer switch MVX and a reset switch MRES into conduction at the same time. A reset signal after reset of the gate portion of the pixel amplifier MSFM or a signal charge from the photodiode PD is amplified by the pixel amplifier MSFM by controlling and bringing a select switch MSEL into conduction and is output to a vertical signal line Vh. A current source switch MRV of the pixel amplifier MSFM is provided outside the imaging region of a pixel element. Dispersion in the gate portion and the pixel amplifier MSFM is removed to attain low noise by carrying out difference between the reset signal and the signal charge with a CDS circuit unit (not illustrated in the drawing) in the subsequent stage. Here, in FIG. 6, control pulses φSEL and φTX may share a common control line.

Figure 7:
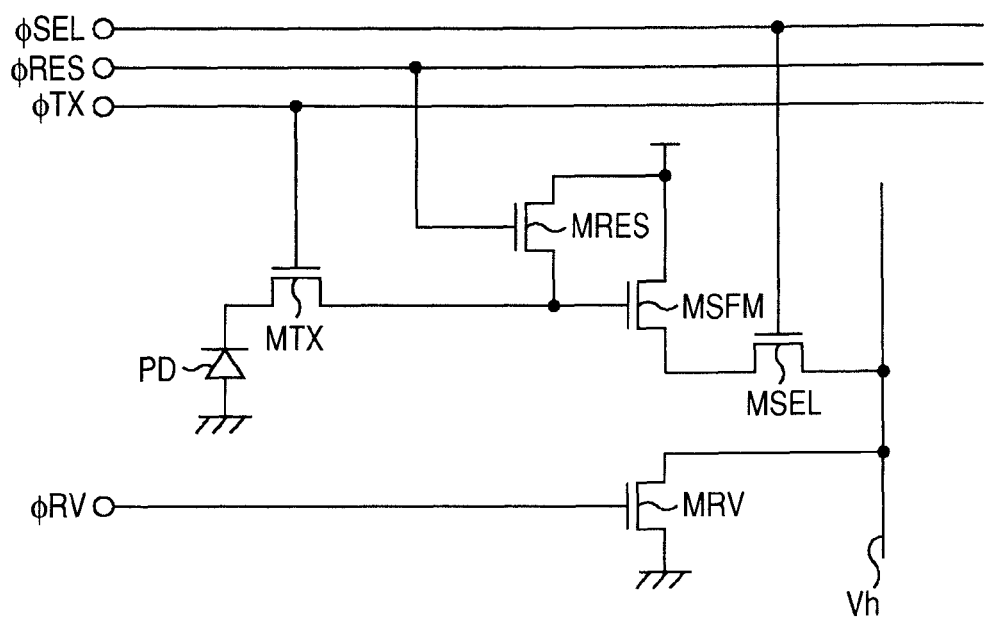
FIG. 7 is a diagram illustrating an example of a circuit in a unit pixel element of a pixel region.

In addition, the example illustrated in FIG. 4 illustrates the case where the pixel for thinned out image is provided on the row unit of the pixel region 121. In the example illustrated in FIG. 4, each pixel element is controlled on the row unit and therefore will naturally carry out exposure on the row unit. In addition, the present example is effective in the case where horizontal resolution of a thinned out image is regarded significant. If in the present example, the pixel for thinned out image is utilized as a point pixel element as in FIG. 3, signals are selected and output by a horizontal scanning circuit unit of the sensor unit (imaging device) 120 or a pixel element read from the sensor unit (imaging device) 120 as in FIG. 3 and utilized from memory of the signal processing circuit unit 130 can be selected. FIG. 7 illustrates an example of a circuit diagram of an optimum unit pixel element for the example illustrated in FIG. 4.

FIG. 7 is a diagram illustrating an example of a circuit in a unit pixel element of a pixel region. In the unit pixel element 121a illustrated in FIG. 7, one photodiode PD comprises one pixel amplifier MSFM. However, in that case, random access scanning of a pixel element is not feasible but the gist of the present invention will not be spoiled.

Figure 8:
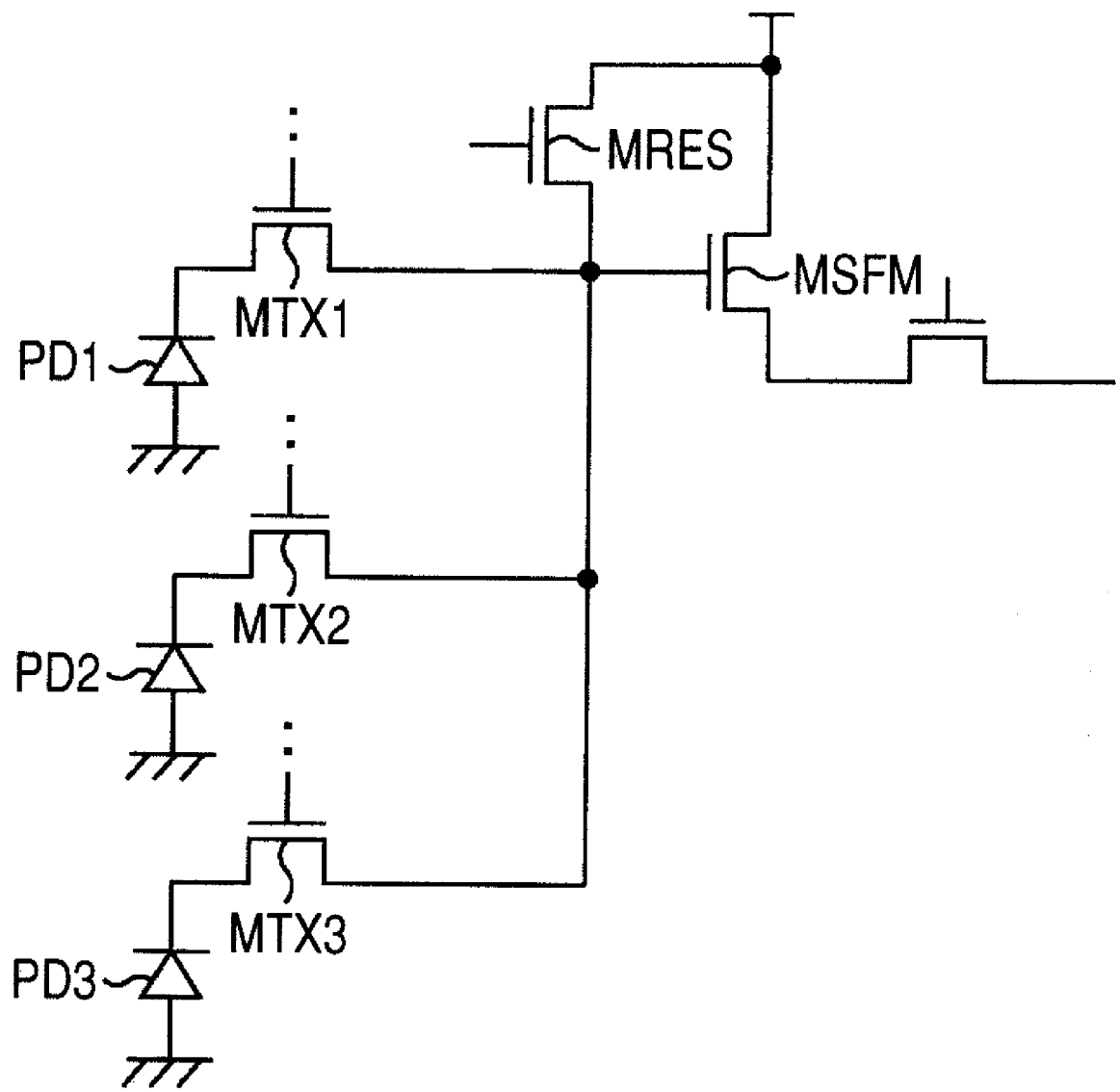
FIG. 8 is a diagram illustrating another example of a circuit in a pixel region.

In addition, another example of a circuit in the pixel region 121 is illustrated in FIG. 8. As illustrated in FIG. 8, one pixel amplifier MSFM can comprise a plurality of photodiodes PD. Specifically, in FIG. 8, a plurality of photodiodes PD, a plurality of transfer switches MYX for horizontal selection and one reset switch MRES are arranged for one pixel amplifier MSFM. Configuring as illustrated in FIG. 8, areas of the transfer switch MVX for vertical selection for one photodiode and of the pixel amplifier MSFM become small and consequently there is an effect to improve the aperture ratio of the photodiode.

The example illustrated in FIG. 5 is an example wherein only a point pixel signal is utilized and the other signals are not utilized as a thinned out image in pixel elements on the column and row related to the pixel for thinned out image. The circuits illustrated in FIG. 7 and FIG. 8 will become an example of a circuit diagram of an optimum pixel region for the example illustrated in FIG. 5.

As a representative specific embodiment of the present invention to be described below, an imaging device with the example illustrated in FIG. 5 as an assumption will be described. Here, as a specific embodiment of the present invention, a mode applied to an imaging device with the example illustrated in FIG. 3 or the example illustrated in FIG. 4 as an assumption will be naturally included in the present invention.

Figure 9:
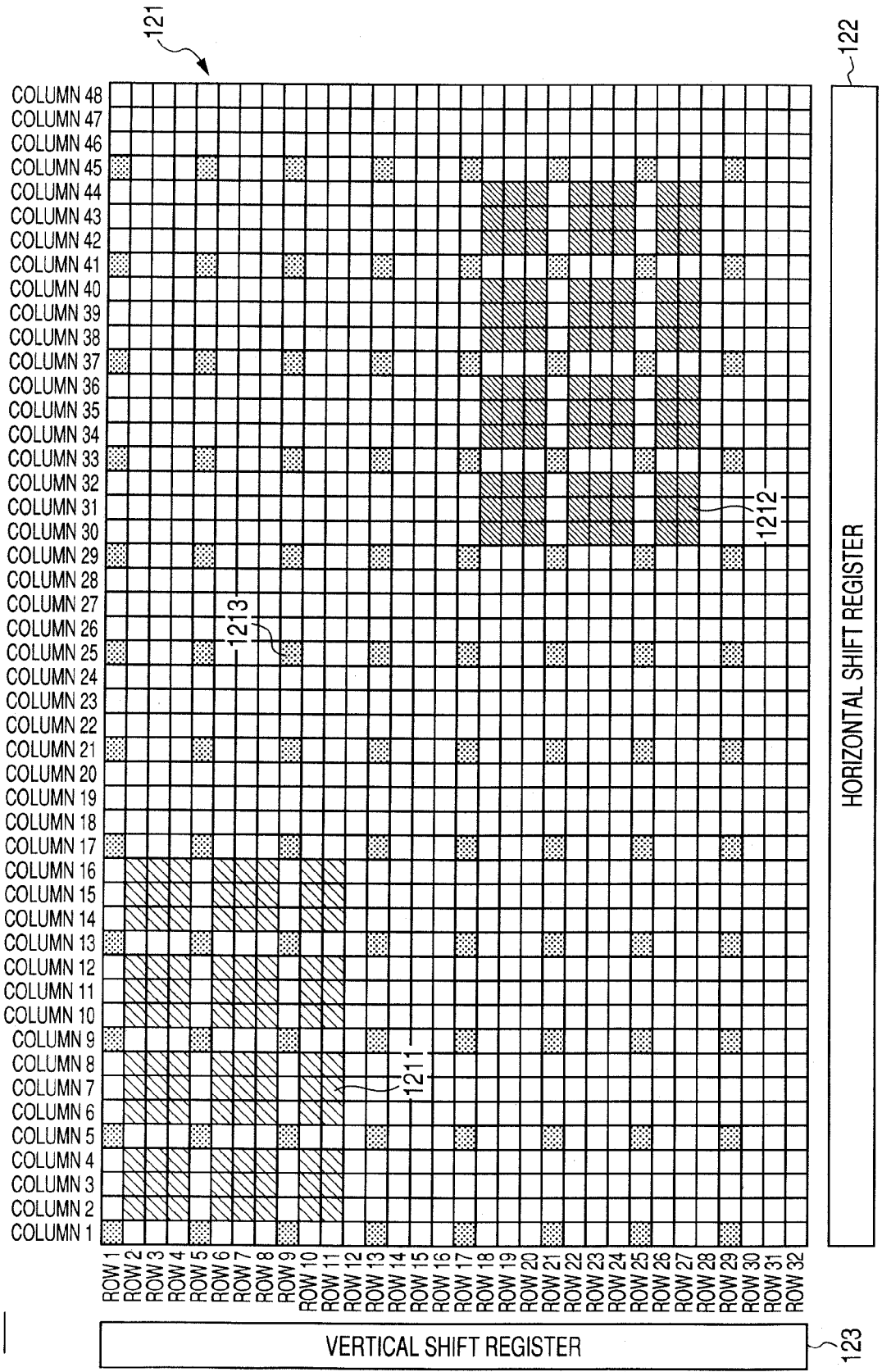
FIG. 9 is a diagram illustrating an example of a schematic configuration of a sensor unit (imaging device) of an imaging device related to an embodiment of the present invention.

FIG. 9 is a diagram illustrating an example of a schematic configuration of a sensor unit (imaging device) 120 of an imaging device 100 related to an embodiment of the present invention. As illustrated in FIG. 9, the sensor unit (imaging device) 120 comprises a pixel region 121, a horizontal shift register 122 for scanning the pixel region 121 in the horizontal direction (row direction) and a vertical shift register 123 for scanning the pixel region 121 in the vertical direction (column direction). The pixel region 121 comprises a plurality of unit pixel elements (121a) in a two-dimensional matrix and images the incident light of an object as an image. In an example illustrated in FIG. 9, an example wherein the pixel region 121 comprises unit pixel elements of 32 rows×48 columns is illustrated for making description understandable.

The horizontal shift register 122 and the vertical shift register 123 are configured so that the method for scanning can be changed according to an image to be read based on control by the system control circuit unit 160 (see FIG. 1) through the timing control circuit unit 150 (see FIG. 1). That is, the horizontal shift register 122 and the vertical shift register 123 comprise a "reading unit" for thinning out a pixel element from the pixel region 121, reading a thinned out image in low resolution and reading a partial image in resolution higher than the thinned out image from a partial region of the pixel region 121. Thereby, low resolution reading for reading a pixel signal only of a pixel element 1213 for thinned out image at a predetermined thinning-out rate and high resolution reading for reading a pixel signal of a first pixel element 1211 for partial image and a second pixel element 1212 for partial image are feasible.

In addition, as illustrated in FIG. 9, the relevant reading unit reads the thinned out image and the partial image from mutually different pixel elements in the pixel elements of the pixel region 121 and reads the thinned out image and the partial image as different imaging frames.

In addition, in the example illustrated in FIG. 9, as the partial region of the pixel region 121 reading the partial image in high resolution, two partial regions are illustrated but the relevant partial region can be provided only one in the pixel region 121. In addition, the three or more relevant partial regions can be provided in the pixel region 121.

Next, a method of driving the horizontal shift register 122 and the vertical shift register 123 being the reading unit of this sensor unit (imaging device) 120 will be described. Here, the reading unit thins out pixel elements from the pixel region 121 in an arbitrary cycle and reads a thinned out image and reads the partial image in high resolution from the above described thinned out pixel elements (pixel elements besides the pixel elements read for the thinned out image) of the pixel region 121. And, in the case of the present embodiment, a thinning-out rate when a pixel signal of the pixel element 1213 for thinned out image is read in low resolution is set to ¼ pixel element.

Figure 10:
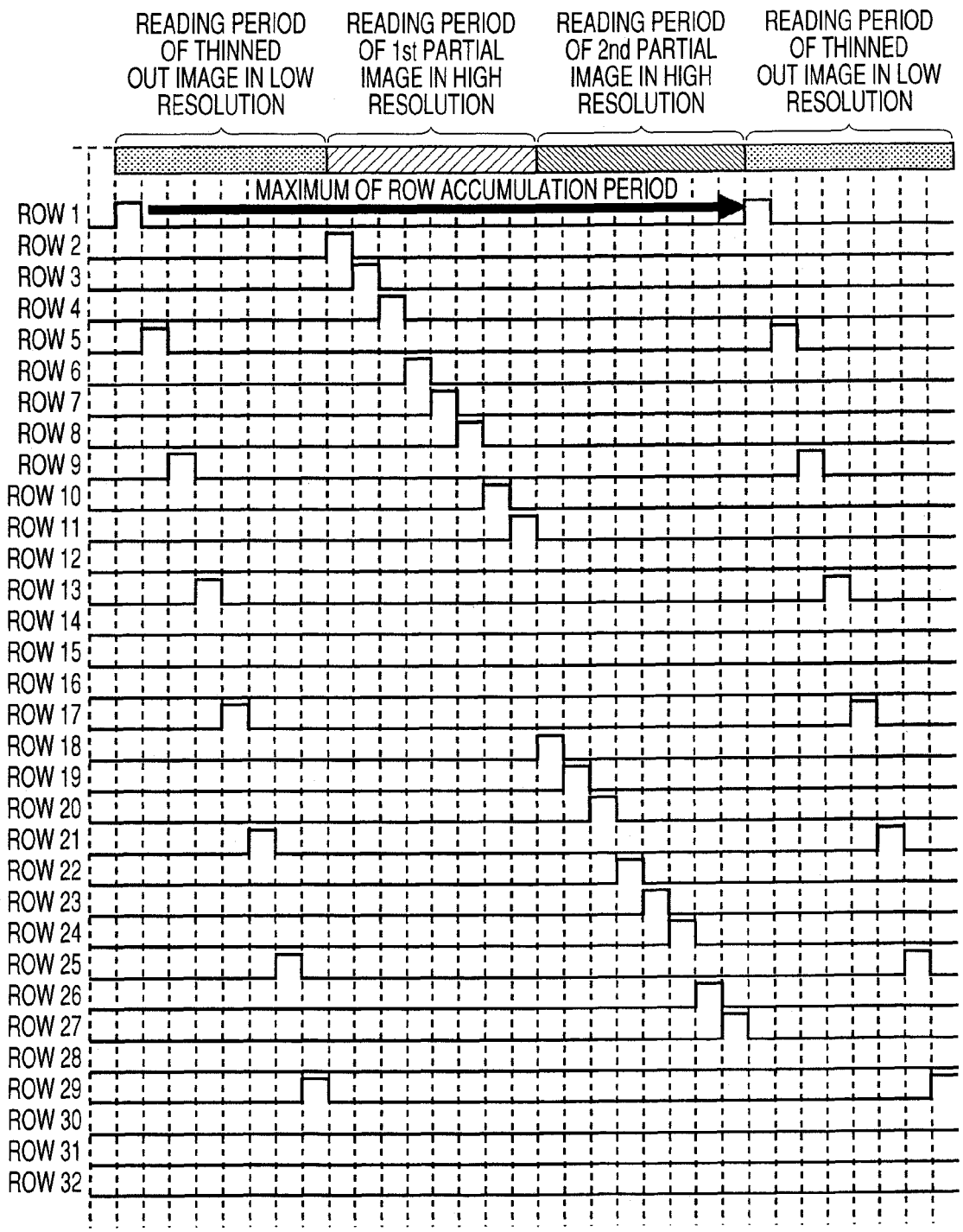
FIG. 10 is a timing chart illustrating an example of a method of driving an imaging device related to an embodiment of the present invention.

FIG. 10 is a timing chart illustrating an example of a method of driving an imaging device 100 related to an embodiment of the present invention. Specifically, FIG. 10 illustrates timing for reading a pixel signal of the pixel element on each row in the sensor unit (imaging device) 120 of the imaging device 100. In addition, in FIG. 10, rows are read when pulses are in High periods.

At first, in the case of reading the pixel signal of the pixel element 1213 for thinned out image in low resolution illustrated in FIG. 9, the vertical shift register 123 reads the row 1 and, thereafter, reads every four rows such as the row 5, the row 9, the row 13, the row 17, the row 21, the row 25 and the row 29. Here, although not illustrated in FIG. 10, for driving the horizontal shift register 122 on each row, the column 1 is read and, thereafter, thinning out and reading every four columns such as the column 5, the column 9, . . . the column 45 is performed.

Subsequently, in order to read the pixel signal of the pixel element 1211 for first partial image in high resolution, the vertical shift register 123 is reset at first and the processing is returned to the head row. And, if the region for the first partial image in high resolution is a region starting from the row 2 as illustrated in FIG. 9, the vertical shift register 123 reads the row 2 and, thereafter, reads the row 3 and the row 4, next skips the row 5 and reads the row 6, the row 7 and the row 8. And, next the register skips the row 9 and reads the row 10 and the row 11 to read the pixel signal of the pixel element of a first partial image region 1211 in high resolution. That is, the vertical shift register 123 does not read the relevant pixel signals for the rows having undergone reading the pixel signal of the pixel element 1213 for thinned out image in low resolution such as the row 1, the row 5 and the row 9 but reads the other necessary rows And, after the previous rows for necessary reading, that is, up to the row 11 in the present example are read, the vertical shift register 123 is reset to return to the head row and reads the pixel signal of the pixel element 1212 for second partial image in high resolution.

For reading the pixel element 1212 for second partial image in high resolution, reading the pixel signal is not carried out on the row having undergone reading the pixel element 1213 for thinned out image in low resolution likewise reading the pixel element 1211 for first partial image in high resolution. Specifically, as for reading the pixel element 1212 for second partial image in high resolution, the vertical shift register 123 is driven so as to read the row 18 to the row 20, the row 22 to the row 24, the row 26 and the row 27 in the present example.

Here, occasionally, in reading the first partial image and the second partial image in high resolution, the problem of discontinuity of images by skipping reading of the read rows of the pixel element 1213 for thinned out image is also considered to occur. In that case, the signal processing circuit unit 130 (see FIG. 1) in the subsequent stage can be arranged to carry out complementary processing on the skipped and not read pixel element 1213 for thinned out image from the reading row in the partial images in upper and lower high resolution.

In addition, as for a method of driving the horizontal shift register 122 in the pixel element 1211 for first partial image and the pixel element 1212 for second partial image in high resolution, any of two methods to be described below can be used.

The first one is a driving method by reading only necessary columns other than the columns undergoing reading of thinned out images in low resolution, that is, the column 1, the column 5, the column 9, . . . , the column 45. This driving method is a driving method in the case illustrated in FIG. 9. At that time, when discontinuity of images due to skipped reading of the read columns of the thinned our images gives rise to a problem, the signal processing circuit unit 130 in the subsequent stage can carry out complementary processing likewise the case of the rows.

The second one is a driving method wherein the horizontal shift register 122 reads all columns. In that case, while one in four rows is not read, columns are all read. Therefore, the aspect ratio of the imaged image will be changed. Accordingly, the signal processing circuit unit 130 in the subsequent stage also carries out complementary processing thereon.

An accumulation period of each pixel element in the drive of the sensor unit (imaging device) 120 related to the present embodiment will be as follows. At first, the maximum accumulation period is a period from reading of row in the previous frame to reading in the next frame. For example, as specified by an arrow in FIG. 10, the row 1 covers from reading of the previous frame to reading of the next frame. During that period, while reading of two frames of the partial image in high resolution is carried out in another row, the accumulation operation is going on in the row 1.

In the case where an accumulation period shorter than that maximum accumulation period is desired to be set, a pulse for resetting accumulation can be input from the timing control circuit unit 150 (see FIG. 1) with arbitrary timing after completion of reading the previous frame. FIG. 11 illustrates such a manner.

FIG. 11 is a timing chart illustrating an example of input timing of a reset pulse determining setting of an accumulation period of a pixel element in a row 1. The case illustrated in FIG. 11A is the case where the accumulation time is maximum and is an example wherein a reset pulse is input immediately after previous frame reading to carry out resetting to start the accumulation operation and accumulation goes on until reading the next frame. FIG. 11B illustrates an example wherein the reset pulse is input in the middle of reading and, therefore, the substantial accumulation period is shortened from after the completion of the reset operation by the relevant reset pulse to reading of the next frame.

Frequently, there is the case where proper exposure of a thinned out image in low resolution is not the same as proper exposure of a partial image in high resolution.

For example, when the entire scenery of a town is read as a thinned out image in low resolution and people passing in the shadow of a building are simultaneously read as a partial image in high resolution, the output level of the portion in the shadow of the building will become low. Thus, in the case of a situation with proper exposure being different for each read region, the embodiments of the present invention carry out the following two operations individually or in a mixed manner.

The first one differently controls accumulation time in each imaging frame of the thinned out image in low resolution and the partial image in high resolution. As described previously, in the present embodiment, the pixel element 1213 for thinned out image in low resolution is different from the pixel elements 1211 and 1212 for partial image in high resolution. Accordingly, even if the row for reading the thinned out image is reset with timing illustrated in FIG. 11B to shorten the accumulation period, the accumulation periods of the first partial image and the second partial image in high resolution will not be influenced but exposure control on each image is independently feasible. Accordingly, in the present embodiment, for example, the system control circuit unit 160 (see FIG. 1) being a control unit controls exposure of the thinned out image in low resolution and the partial image in high resolution independently.

The second one is to change the gain of the reading amplifier (for example, the pixel amplifier MSFM illustrated in FIGS. 6 to 8) in each imaging frame for the thinned out image in low resolution and the partial image in high resolution. In the case of this method, for example, when reading of the thinned out image in low resolution is over and the vertical shift register 123 is reset to return to the head of the rows, setting on the gain of the reading amplifier is simultaneously changed to start reading of the next partial image in high resolution.

If the same pixel element is used for the pixel element 1213 for thinned out image in low resolution and the pixel elements 1211 and 1212 for partial image in high resolution, the system has to comprise two amplifiers, that is, one for thinned out image and one for partial image. Moreover, in that case, if setting of gain is the same, each amplifier will have to comprise a complimentary circuit unit in high accuracy so as to equalize outputs.

However, the imaging device related to the present embodiment is provided with the pixel element 1213 for thinned out image in low resolution and the pixel elements 1211 and 1212 for partial image in high resolution each independently and therefore can comprise one amplifier. Accordingly, complexity in the system can be avoided. Here, in that case, as an advantage of controlling the output level with gain, capability of imaging a moving subject with little shaking is pointed out.

In addition, in FIG. 10, driving frequencies of reading of the thinned out image in low resolution and of reading of the partial image in high resolution are illustrated on the same level. However, a mode where a driving frequency for reading each image is made different for each frame can also be applied to the imaging device of the present embodiment. That is, in the present embodiment, the horizontal shift register 122 and the vertical shift register 123, for example, carries out reading with different driving frequencies for reading the thinned out image and for reading the partial image.

Figure 12:
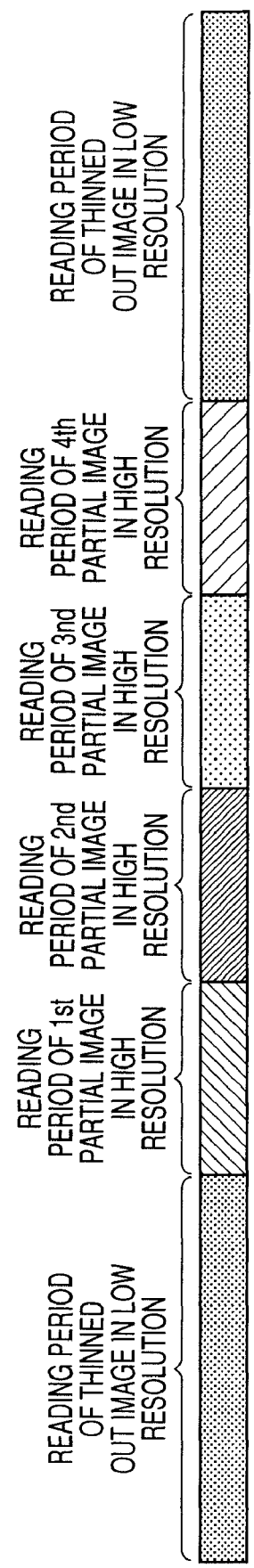
FIG. 12 is a timing chart illustrating an embodiment of the present invention and illustrating an example of changing driving frequencies for reading a thinned out image in low resolution and for reading a partial image in high resolution.

FIG. 12 illustrates an embodiment of the present invention and is a timing chart illustrating an example of changing driving frequencies for reading the thinned out image in low resolution and for reading the partial image in high resolution. The example illustrated in FIG. 12 is specifically an example wherein the driving frequency for reading the partial image in high resolution is twice larger than the driving frequency for reading the thinned out image in low resolution. Thereby, in addition to reading of the relevant first and second partial images, reading of the third and the fourth partial images can be further added at the same period as the period for reading the first and the second partial images in high resolutions illustrated in FIG. 11.

Here, the present embodiment comprises pixel elements in the pixel region 121 illustrated in FIG. 9 in 32 rows×48 columns and with a thinning-out rate of ¼ pixel element but will not be limited hereto for designing an actual pixel region 121. In addition, also on the region for reading an image, in the present embodiment, regions of the pixel element 1213 for thinned out image in low resolution and the pixel elements 1211 and 1212 for partial image in high resolution have been described but will not actually be limited to this combination. Moreover, in order to simplify description on the driving frequency at the occasion of reading each image, in the example illustrated in FIG. 12, the driving frequency for reading the partial image in high resolution is uniformly twice larger than the driving frequency for reading the thinned out image in low resolution but will not be limited to the twice larger frequency. In addition, the case where the driving frequency is different for reading of each image is applicable.

The imaging device 100 of the present embodiment reads the thinned out image in low resolution and the partial image in high resolution from mutually different pixel elements and reads the thinned out image and the partial image as different imaging frames. According to such configuration, complexity in reading the image in low resolution and reading the image in high resolution is eliminated and decrease in frame rate can be prevented.

Moreover, the imaging device 100 of the present embodiment can read a plurality of partial images because the driving frequencies for the thinned out image in low resolution and for the partial image in high resolution are different.

The units in FIG. 1 included in the imaging device 100 related to the above described present embodiment and the timing charts in FIGS. 10 to 12 illustrating the driving methods for the imaging device 100 can be realized by causing the program stored in RAM or ROM of a computer to operate. This program and a computer-readable storage medium storing the relevant program are included in the present invention.

Specifically, the above described program is stored in a storage medium such as a CD-ROM and otherwise provided to a computer through various types of transfer media. As the storage medium for storing the above described program, media other than a CD-ROM such as a flexible disk, a hard disk, a magnetic tape, a magnet optical disk, a nonvolatile memory card can be used. On the other hand, as a transfer medium of the above described program, a communication medium in a computer network (LAN, WAN such as the Internet, wireless communication network and the like) system for transferring and supplying program information as a carrier wave can be used. In addition, the communication medium at that occasion can include a wired line such as an optical fiber and a wireless line.

In addition, not only the case where the function of the imaging device 100 related to the present embodiment is realized by causing a computer to execute the supplied program, but also the case as described below can be considered.

One thereof is the case where the function of the imaging device 100 related to the present embodiment is realized by cooperation of the program and an OS (operating system) or another application software and the like in operation in a computer. The other one is the case where the function of the imaging device 100 related to the present embodiment is realized by causing a function expanding board and a function expanding unit of the computer to carry out all or a part of processing of the supplied program. The program in such cases as described above is included in the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-055769, filed Mar. 6, 2007, which is hereby incorporated by reference herein in its entirety.

What is claimed is:

1. An imaging device comprising:
   a pixel region that includes a plurality of pixel elements for imaging an object based on an incident light; and
   a reading unit for reading out a thinned out image at a low resolution by thinning out a pixel element from the pixel region, and for reading out a partial image at a higher resolution than the low resolution of the thinned out image, the reading unit reading out the partial image from a partial region of the pixel region,
   wherein the reading unit reads out the thinned out image in a first frame from a first set of the plurality of pixel elements and reads out the partial image in a second frame from a second set of the plurality of pixel elements excluding the first set of the plurality of pixel elements, and
   wherein the first and second frames are consecutive frames.

2. The imaging device according to claim 1, wherein the partial region is one of a plurality of partial regions from which the partial image is to be read out, the plurality of partial regions being provided in the pixel region.

3. The imaging device according to claim 1, wherein the reading unit reads out the thinned out image by thinning out the pixel element at an arbitrary frequency from the pixel region, and reads out the partial image from the thinned out pixel element.

4. The imaging device according to claim 1, further comprising a control unit for controlling independently exposures for the thinned out image and the partial image.

5. The imaging device according to claim 1, wherein the reading unit performs the reading out of the thinned out image and the reading out of the partial image at different driving frequencies.

6. A method for driving an imaging device that includes a pixel region with a plurality of pixel elements, for imaging an object based on an incident light, the method comprising:
   reading out a thinned out image at a low resolution by thinning out a pixel element from the pixel region; and
   reading out a partial image from a partial region of the pixel region at a higher resolution than the low resolution of the thinned out image,
   wherein the thinned out image includes signals read out from a first set of the plurality of pixel elements, and the partial image includes signals read out from a second set of the plurality of pixel elements excluding the first set of the plurality of pixel elements, and
   wherein the thinned out image and the partial image are read out respectively from different imaging frames.

7. A reading unit comprising:
   a pixel region that includes a plurality of pixel elements, for imaging an object based on an incident light; and
   a reading unit for reading out a thinned out image at a low resolution by thinning out a pixel element from the pixel region, and for reading out a partial image at a higher resolution than the low resolution of the thinned out image, the partial image being read out from a partial region of the pixel region,
   wherein the reading unit reads out the thinned out image in a first frame from a first set of the plurality of pixel elements, and reads out the partial image in a second frame from a second set of the plurality of pixel elements excluding the first set of the plurality of pixel elements, and
   wherein the first and the second frames are consecutive frames.

* * * * *